United States Patent [19]

O'Connell

[11] 4,109,172
[45] Aug. 22, 1978

[54] HIGH PIEZOELECTRIC COUPLING-TEMPERATURE COMPENSATED BERLINITE SUBSTRATE MEMBER FOR SURFACE ACOUSTIC WAVE DEVICES

[75] Inventor: Robert M. O'Connell, Arlington, Mass.

[73] Assignee: The United States of America as represented by the Secretary of the Air Force, Washington, D.C.

[21] Appl. No.: 826,107

[22] Filed: Aug. 19, 1977

[51] Int. Cl.² ............................................ H01L 41/10
[52] U.S. Cl. ..................................... 310/313; 310/360
[58] Field of Search ................. 310/313, 360; 333/72, 333/30 R; 364/821

[56] References Cited

U.S. PATENT DOCUMENTS

| | | | |
|---|---|---|---|
| 3,866,153 | 2/1975 | Slobodnik, Jr. | 310/313 X |
| 3,956,718 | 5/1976 | Weinert et al. | 310/313 X |
| 3,983,515 | 9/1976 | Mitchell et al. | 310/313 X |
| 4,001,767 | 1/1977 | Slobodnik, Jr. | 310/313 |

*Primary Examiner*—Budd Mark O.
*Attorney, Agent, or Firm*—Joseph E. Rusz; Willard R. Matthews, Jr.

[57] ABSTRACT

A singly rotated propagation surface defining cut of single crystal berlinite (AlPO₄) is utilized to provide a temperature compensated surface acoustic wave (SAW) substrate having a high piezoelectric coupling factor. The preferred embodiment of the invention comprises a berlinite substrate member having a propagation surface that substantially coincides with a plane defined by Euler angles Lambda = 0.0°, mu = 80.4°, and Theta = 0.0°.

1 Claim, 7 Drawing Figures

HIGH PIEZOELECTRIC COUPLING-TEMPERATURE COMPENSATED BERLINITE SUBSTRATE MEMBER FOR SURFACE ACOUSTIC WAVE DEVICES

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic device substrate members, and in particular to improvements in the piezoelectric coupling characteristics of such devices.

Surface acoustic wave devices such as filters, delay lines, encoders, decoders, correlators, and other signal processing means, commonly use standard ST cut quartz substrate. This substrate, however, has a typically low piezoelectric coupling factor. A significant problem exists then, when there are required low insertion loss, temperature compensated surface acoustic wave devices having larger bandwidths than those obtained in devices built on ST cut quartz.

Currently, lithium niobate ($LiNbO_3$) is used in surface acoustic wave devices requiring greater bandwidth (for a given amount of insertion loss) than that obtainable with ST cut quartz. However, since $LiNbO_3$ is not temperature compensated, bulky and costly ovens are required for temperature control.

Other attempts to solve the problem have met with various degrees of success. $Tl_3VS_4$, for example, has been found to be temperature compensated with substantially better piezoelectric coupling than ST cut quartz. The SAW velocity for this material, about 900 m/sec, is relatively slow, which is a disadvantage for high frequency filter applications but an advantage for long delay lines. The main drawback to the material is that the electromechanical power flow angle corresponding to the temperature compensated cut is rather large, about −17°.

Another substrate material, a temperature compensated composite, produced by sputtering a film of silicon dioxide on YZ lithium tantalate, has been found to exhibit a very small electromechanical power flow angle, a piezoelectric coupling of about 0.007, and a relatively large SAW velocity. The most attractive feature of the material is that its second order temperature coefficient of time delay is nearly an order of magnitude smaller than that of ST cut quartz. The main drawbacks of the composite are: (1) the need to very accurately control the thickness of the $SiO_2$ film; (2) the loss in the film at high frequencies, and (3) the SAW dispersion in the film.

Other state-of-the-art solutions are subject to the same or similar trade-offs and limitations.

In view of the foregoing, it is apparent that the development of improved broad-band, low insertion loss surface acoustic wave devices with temperature independent performance characteristics will require substrate materials that are temperature compensated and have piezoelectric coupling greater than that of ST cut quartz. The present invention is directed toward satisfying that requirement.

SUMMARY OF THE INVENTION

Calculations of the surface acoustic wave (SAW) properties of berlinite, $AlPO_4$, have produced a pure mode crystallographic orientation which is temperature compensated and has more than four times the piezoelectric coupling of ST cut quartz. This cut is a singly rotated direct analog of the ST cut of quartz. It has, like ST quartz, a zero electromechanical power flow angle, but the distinct advantage of more than four times the piezoelectric coupling. These advantages are utilized by a berlinite SAW substrate having a surface acoustic wave propagation surface that coincides with that particular crystallographic orientation. The crystallographic orientation is defined by the Euler angle Lambda = 0.0°, mu = 80.4°, and Theta = 0.0°.

It is a principal object of the invention to provide a new and improved substrate member for surface acoustic wave devices.

It is another object of the invention to provide a surface acoustic wave substrate member that is temperature compensated and that has better piezoelectric coupling characteristics than ST cut quartz and other known substrates.

It is another object of the invention to provide a temperature compensated surface acoustic wave substrate member having improved piezoelectric coupling characteristics that does not require costly and bulky ovens to achieve temperature control.

These, together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

As indicated above, there currently exists the need for substrate materials that are temperature compensated and have piezoelectric coupling greater than that of ST cut quartz. A major contribution to the search for such materials has been the development of a phenomenological model which explains why known materials are temperature compensated. According to that model, temperature compensated materials possess either of the following anomalous properties: (1) a positive temperature coefficient of velocity or elastic constant, or (2) a negative coefficient of thermal expansion. Quartz, for example, is temperature compensated because the temperature coefficient of $C_{66}$, the elastic constant for shear propagation along the Z axis, is positive.

Berlinite, $AlPO_4$, is structurally similar to quartz with larger piezoelectric constants. It has been shown that for bulk waves berlinite is indeed temperature compensated along orientations similar to the AT and BT cuts of quartz, but with 2.5 times larger piezoelectric coupling. Motivated by these results for bulk waves and the fact that the temperature coefficient of one of berlinite's elastic constants is positive, an investigation of the behavior of surface acoustic waves (SAW) on berlinite has produced several temperature compensated cuts with more than four times the piezoelectric coupling of ST cut quartz.

Figure 1:
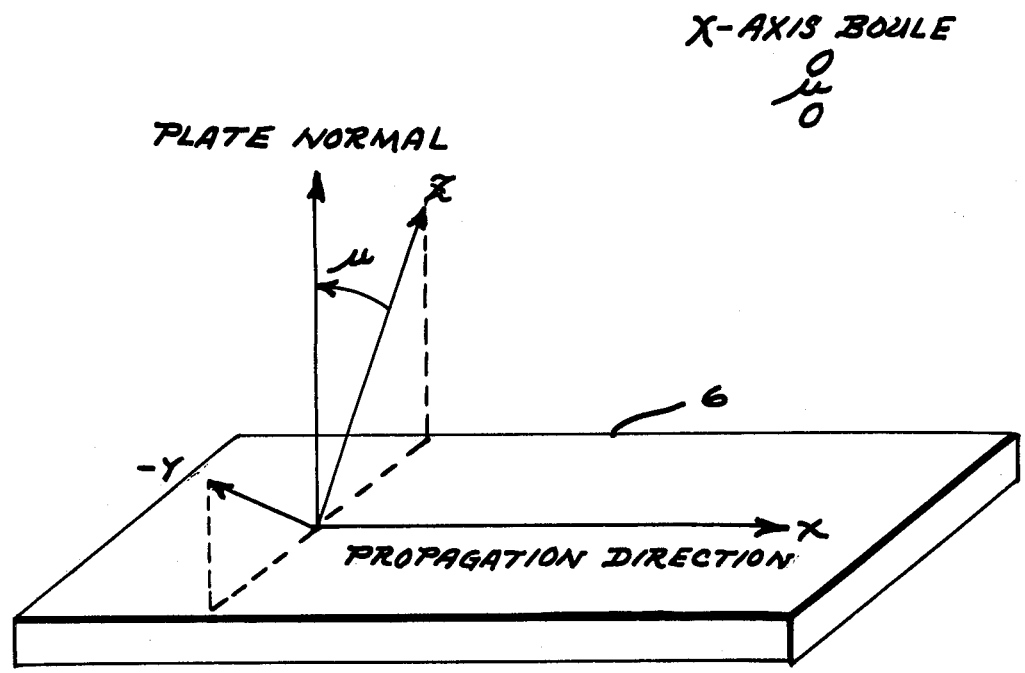
FIG. 1 illustrates a surface acoustic wave device substrate member of the type comprehended by the invention.
Figure 5A:
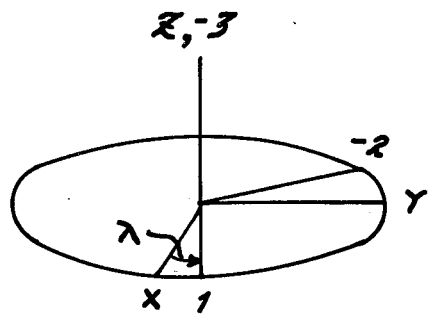
FIGS. 5a, 5b and 5c illustrate the coordinate system used to define acoustic surface wave propagation in terms of Euler angles.
Figure 5B:
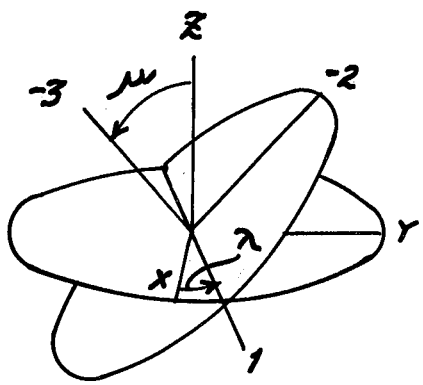
Figure 5C:
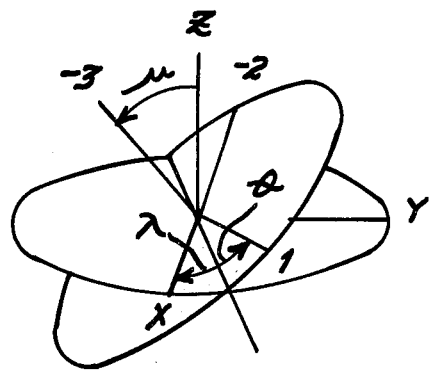

The substrate member comprehended by the present invention utilizes a particular one of these berlinite cuts identified as a singly rotated boule cut. FIG. 1 illustrates the substrate member 6 of the invention indicating the crystallographic cut in Euler angles. The particular cut of the invention is defined by the Euler angles Lambda = 0.0°, mu = 80.4°, and Theta = 90.0°. Euler angles are described in FIGS. 5a, 5b, and 5c. To establish a given crystallographic orientation, the propagation axes 1, -2, -3 are transformed relative to the crystalline axes X, Y, Z with which they are initially aligned, by means of three successive rotations performed in a specific sequence. The angles of the rotations in this sequence are defined as the Euler angles.

The transformation sequence begins by rotating the 1 and -2 axes counterclockwise about the Z axis through angle λ. Next, the -2 and -3 axes are rotated counterclockwise about the 1 axis through angle μ. Finally, the 1 and -2 axes are rotated counterclockwise about the -3 axis through angle θ. The resultant direction of the 1 axis defines the phase velocity vector or the direction of propagation, and the resultant direction of the -3 axis defines the plate normal.

Figure 2:
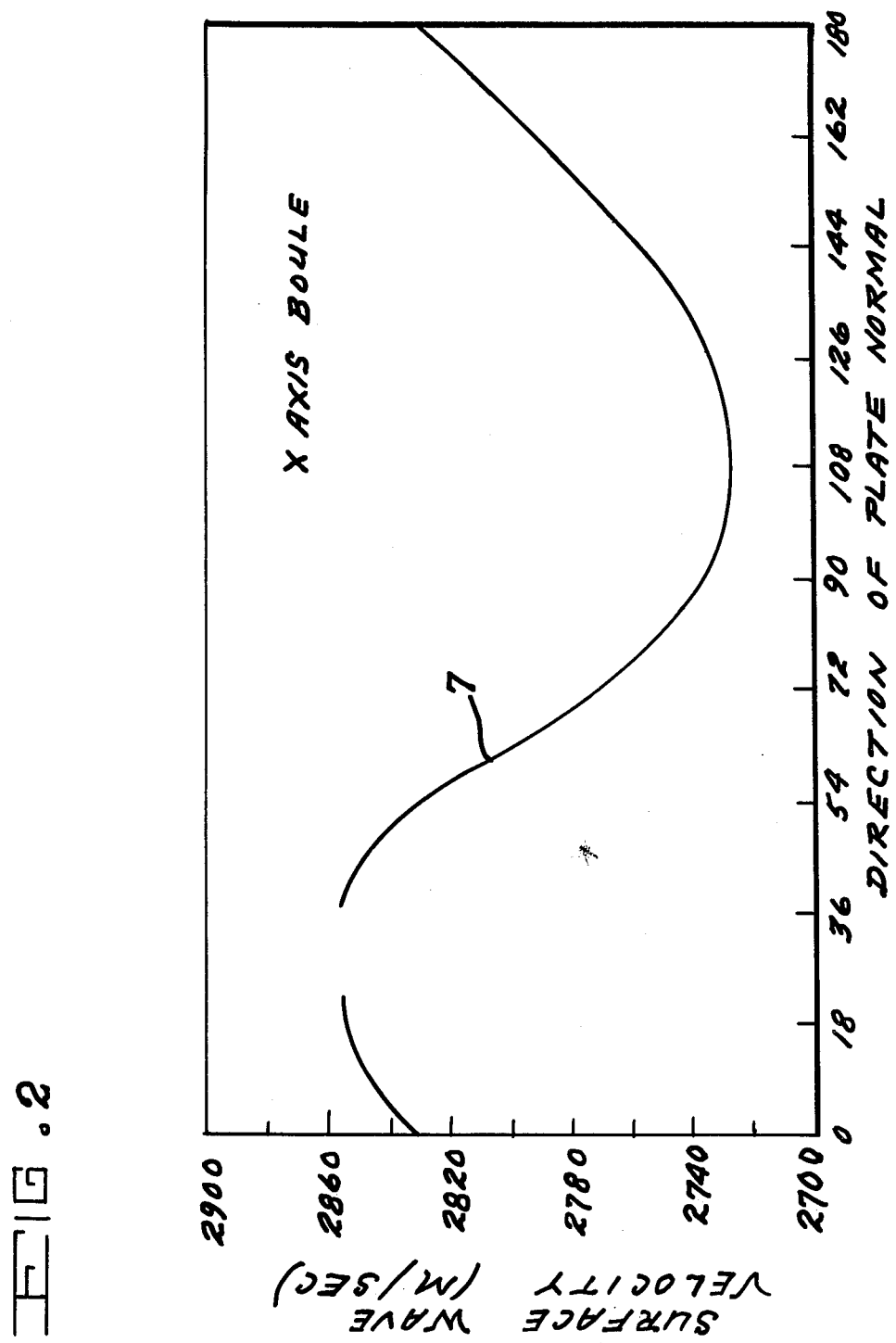
FIG. 2 is a curve illustrating the variation of SAW velocity for X-axis boule berlinite.
Figure 3:
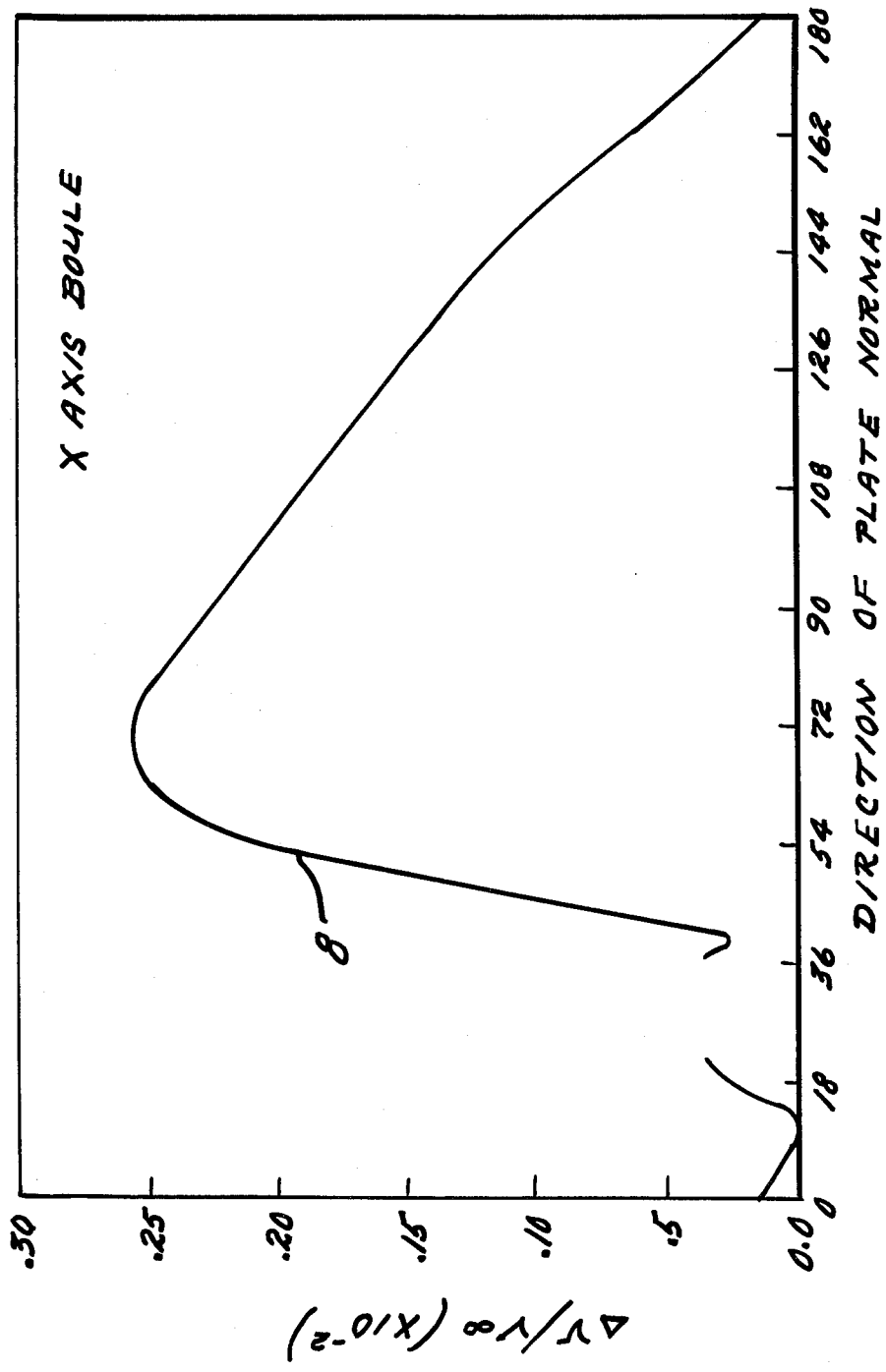
FIG. 3 is a curve illustrating the piezoelectric coupling for X-axis boule berlinite.
Figure 4:
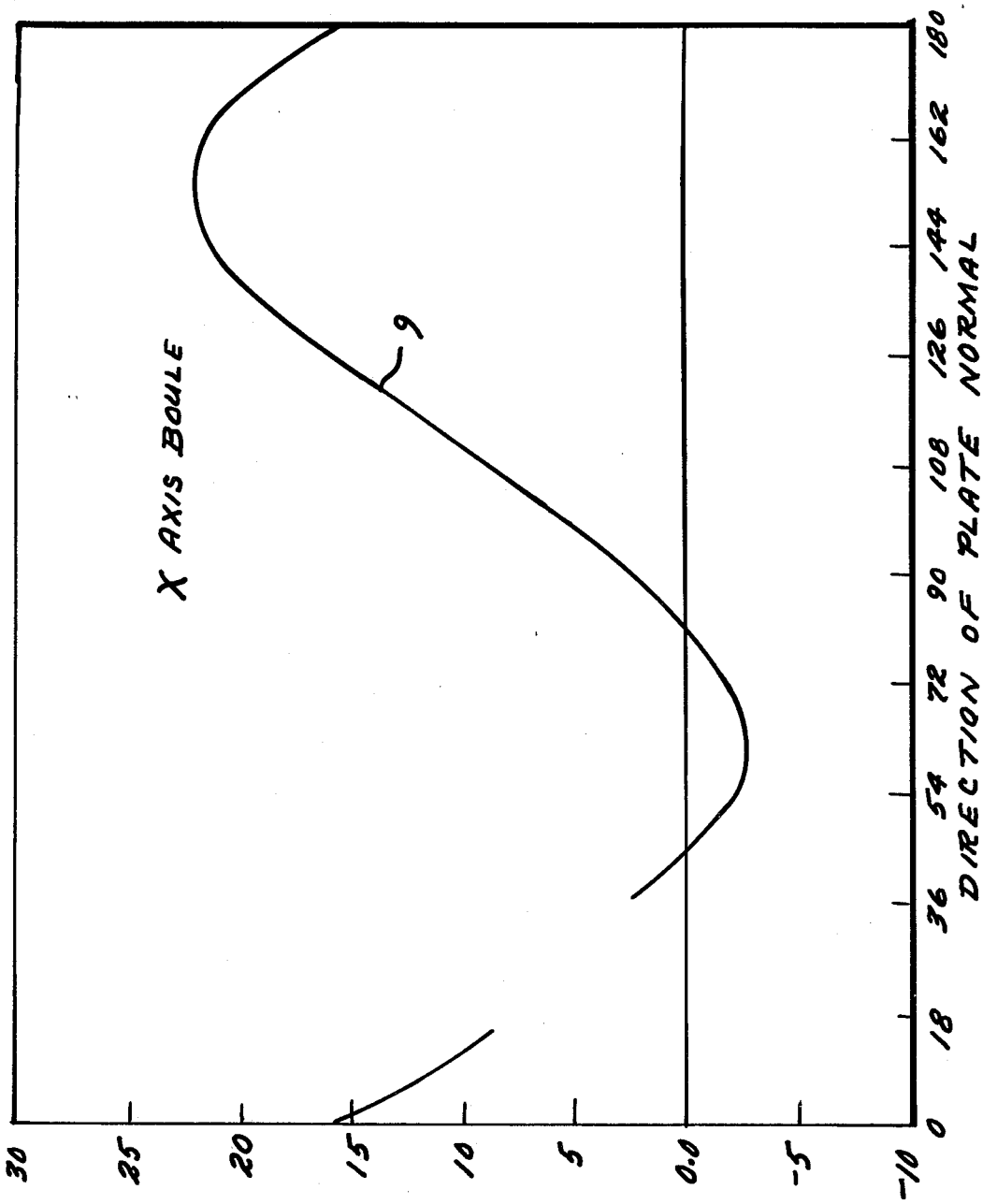
FIG. 4 is a curve illustrating the temperature coefficient of time delay for X-axis boule berlinite.

Results for the cut defined above are shown by SAW velocity curve 7 of FIG. 2, piezoelectric coupling curve 8 of FIG. 3, and temperature coefficient of delay curve 9 of FIG. 4. The shapes of the curves are identical to the corresponding curves for quartz, which is to be expected since the materials are so much alike. No curve is shown for the electromechanical power flow angle of the X axis boule because for crystals of the $D_3$ (32) class the X axis is even-fold: in such cases, the phase velocity and power flux are collinear: i.e., the power flow angle is identically zero.

As can be seen from FIGS. 2, 3 and 4, an independent temperature compensated orientation for the X axis boule occurs at Euler angles Lambda = 0.0°, Gamma = 80.4°, and Theta - 0.0°. At this point the corresponding value of the electromechanical power flow angle ($\phi$ in degrees) is 0.0°; the slope of the electromechanical power flow angle ($\delta\phi/\delta\theta$) is 0.901; the piezoelectric coupling ($\Delta v/V\infty$) is $0.245 \times 10^{-2}$; and, the SAW velocity is 2751 m/sec.

While the invention has been described in terms of its preferred embodiment it is understood that the words which have been used are words of description rather than words of limitation and that changes within the purview of the appended claims may be made without departing from the scope and spirit of the invention in its broader aspects.

What is claimed is:

1. A surface acoustic wave device substrate member of single crystal berlinite having an acoustic surrface wave propagation surface defined by a plane that substantially coincides with the Euler angles Lambda = 0.0°, mu = 80.4°, and Theta = 0.0°.

* * * * *